(12) United States Patent
Ji

(10) Patent No.: US 11,847,073 B2
(45) Date of Patent: Dec. 19, 2023

(54) DATA PATH INTERFACE CIRCUIT, MEMORY AND MEMORY SYSTEM

(71) Applicant: CHANGXIN MEMORY TECHNOLOGIES, INC., Hefei (CN)

(72) Inventor: Kangling Ji, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 186 days.

(21) Appl. No.: 17/446,571

(22) Filed: Aug. 31, 2021

(65) Prior Publication Data
US 2022/0092007 A1    Mar. 24, 2022

Related U.S. Application Data

(63) Continuation of application No. PCT/CN2021/100794, filed on Jun. 18, 2021.

(30) Foreign Application Priority Data

Sep. 23, 2020    (CN) .......................... 202011006722.X

(51) Int. Cl.
G06F 13/16    (2006.01)
G11C 7/10    (2006.01)
(Continued)

(52) U.S. Cl.
CPC ................................ G06F 13/1689 (2013.01)

(58) Field of Classification Search
CPC . G11C 11/4063; G11C 29/028; G11C 7/1093; G11C 7/22; G11C 16/10;
(Continued)

(56) References Cited

U.S. PATENT DOCUMENTS 6,784,889 B1 * 8/2004 Radke ..................... G09G 5/39
345/506
7,610,453 B1 * 10/2009 Parekh .................... G06F 7/785
711/E12.045
(Continued)

FOREIGN PATENT DOCUMENTS

CN    101286362 A    10/2008
CN    101876946 A    11/2010
(Continued)

OTHER PUBLICATIONS

Supplementary European Search Report in the European application No. 21859353.1, dated Nov. 9, 2022.
(Continued)

Primary Examiner — Chun Kuan Lee
(74) Attorney, Agent, or Firm — SYNCODA LLC; Feng Ma

(57) ABSTRACT

A data path interface circuit includes: a writing path module, connected to an internal port and an external port and configured to transmit stored data to the internal port from the external port; a reading path module, connected to the internal port and external port respectively and configured to transmit the stored data to the external port from the internal port; a first delay module, connected to the external port and internal port respectively, and configured to obtain the stored data from the external port or internal port, perform delay processing on the stored data, and transmit the delayed stored data to the writing path module and/or reading path module; and a delay control module, connected to the first delay module and configured to receive a signal instruction from external and control delay time for the first delay module to perform the delay processing according to the signal instruction.

18 Claims, 12 Drawing Sheets

(51) Int. Cl.
*G11C 7/22* (2006.01)
*G06F 3/06* (2006.01)
*G11C 11/4063* (2006.01)
*G11C 16/10* (2006.01)
*G11C 29/02* (2006.01)
*G11C 11/4093* (2006.01)
*G11C 11/4076* (2006.01)

(58) Field of Classification Search
CPC ... G11C 29/023; G11C 7/1066; G11C 7/1069; G11C 2207/2254; G06F 3/06; G06F 13/1689
USPC ......................................................... 710/107
See application file for complete search history.

(56) References Cited

U.S. PATENT DOCUMENTS

| | | | |
|---|---|---|---|
| 8,233,340 | B1 | 7/2012 | Chingi Chang |
| 9,570,195 | B2 | 2/2017 | Kashyap |
| 2002/0051401 | A1 | 5/2002 | Lee |
| 2005/0270854 | A1 | 12/2005 | Hyun |
| 2007/0283061 | A1* | 12/2007 | Mueller .............. G06F 11/1641 710/105 |
| 2008/0252352 | A1 | 10/2008 | Kuoyuan |
| 2009/0040846 | A1 | 2/2009 | Chang |
| 2009/0231944 | A1 | 9/2009 | Faue |
| 2010/0008168 | A1 | 1/2010 | Chang |
| 2010/0271887 | A1 | 10/2010 | Kwak |
| 2010/0281232 | A1 | 11/2010 | Takagi |
| 2012/0263000 | A1 | 10/2012 | Chang |
| 2014/0092699 | A1 | 4/2014 | Hu et al. |
| 2021/0124709 | A1* | 4/2021 | Hsu ..................... G06F 13/4291 |

FOREIGN PATENT DOCUMENTS

| | | |
|---|---|---|
| CN | 103700393 A | 4/2014 |
| CN | 111028873 A | 4/2020 |

OTHER PUBLICATIONS

International Search Report in the international application No. PCT/CN2021/100794, dated Sep. 18, 2021.

\* cited by examiner

DATA PATH INTERFACE CIRCUIT, MEMORY AND MEMORY SYSTEM

CROSS-REFERENCE TO RELATED APPLICATIONS

This is a continuation application of International Patent Application No. PCT/CN2021/100794 filed on Jun. 18, 2021, which claims priority to Chinese Patent Application No. 202011006722.X filed on Sep. 23, 2020. The disclosures of these applications are hereby incorporated by reference in their entirety.

BACKGROUND

A semiconductor memory is a memory that accesses through semiconductor circuits, and a Dynamic Random Access Memory (DRAM) is widely applied to various fields because of its high storage speed and high integration. Multiple memory blocks are generally arranged in the memory to achieve a greater memory space. However, when the current memory is running, data transmission speeds of the different memory blocks are different, which leads to timings of the different memory blocks are inconsistent, and transmission synchronization of stored data is not good.

SUMMARY

The present application relates generally to the field of integrated circuits, and more specifically to a data path interface circuit, a memory and a memory system.

An aspect of the present application provides a data path interface circuit, which includes a writing path module, a reading path module, a first delay module and a delay control module.

The writing path module is connected to an internal port and an external port respectively, and is configured to transmit stored data to the internal port from the external port.

The reading path module is connected to the internal port and the external port respectively, and is configured to transmit the stored data to the external port from the internal port.

The first delay module is connected to the external port and the internal port respectively, and is configured to obtain the stored data from the external port or the internal port, perform delay processing on the stored data, and transmit the delayed stored data to the writing path module and/or the reading path module.

The delay control module is connected to the first delay module and is configured to receive a signal instruction from external and control delay time for the first delay module to perform the delay processing according to the signal instruction.

Another aspect of the present application provides a memory, which includes the data path interface circuit, a data processing module and a memory block.

The data processing module is connected to the external port of the data interface circuit, and is configured to process the stored data.

The memory block is connected to the internal port of the data interface circuit, and is configured to store the stored data.

Another aspect of the present application provides a memory system, which includes the memory, an electronic device and a processing module controller.

The processing module controller is connected to the memory and the electronic device respectively, and is configured to enable a corresponding number of the data processing modules in the memory according to system information of the electronic device.

Details of each of the embodiments of the disclosure are set forth in the following drawings and description. According to the record in the specification, the drawings and the claims, a person skilled in the art will easily understand other features, problems to be solved and advantageous effects of the disclosure.

BRIEF DESCRIPTION OF THE DRAWINGS

One or more drawings may be refereed for a better description and illustration of the embodiments of the present application, but additional details or examples for describing the drawings should not be considered as limiting to any one of the disclosure, the described embodiments or preferred embodiments of the present application.

DETAILED DESCRIPTION

Figure 1:
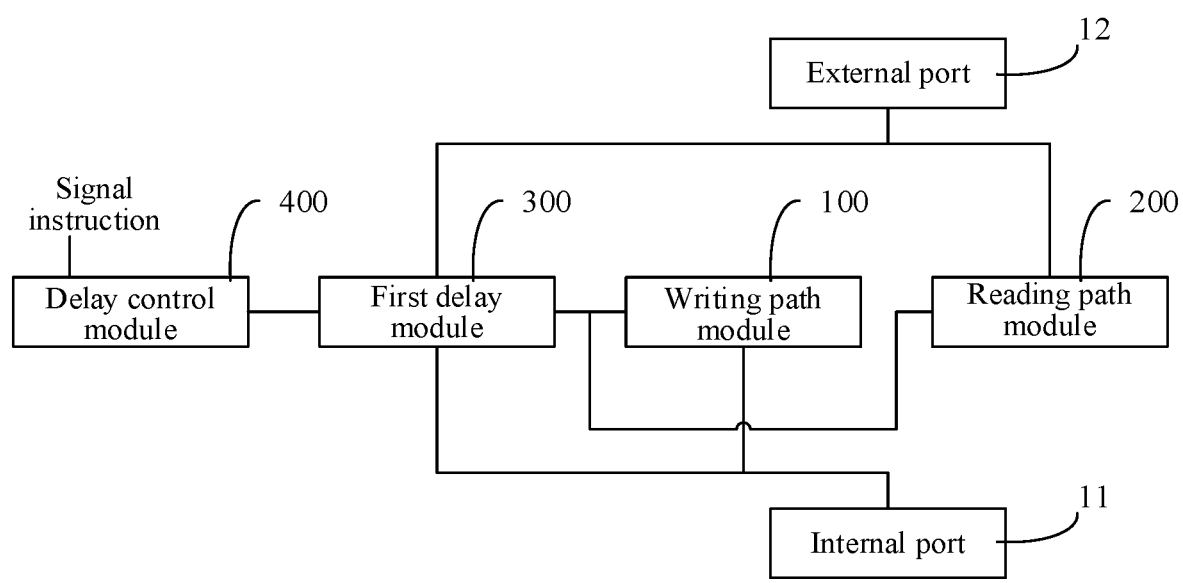
FIG. 1 is a structural schematic diagram of a data path interface circuit in a first embodiment.

To better understand the embodiments of the present application, the embodiments of the present application will be described more comprehensively with reference to the accompanying drawings. The preferred embodiment of the present application is shown in the accompanying drawings. However, the embodiments of the present application may be implemented in many different forms and should not be construed as limited to the embodiments set forth herein. On the contrary, the purpose of providing these embodiments is to make the disclosure of the embodiments of the present application more thorough and comprehensive.

Unless defined otherwise, all technical and scientific terms used herein have the same meaning as commonly understood by those skilled in the art to which the embodiments of the present application belong. The terms used in the specification of the embodiments of the present application are only for describing the specific embodiments, and are not intended to limit the present application. The term "and/or" used herein include any and all combinations of one or more related listed items.

In the descriptions of the embodiments of the present application, it is to be understood that orientation or position relationships indicated by terms "upper", "lower", "vertical", "horizontal", "inner", "outer", and the like are orientation or position relationships shown in the drawings, are adopted not to indicate or imply that indicated devices or components must be in specific orientations or structured and operated in specific orientations but only to conveniently describe the embodiments of the present application and simplify descriptions and thus should not be understood as limits to the embodiments of the present application.

FIG. 1 is a structural schematic diagram of a data path interface circuit 10 in a first embodiment. Referring to FIG. 1, in the embodiment, the data path interface circuit 10 includes a writing path module 100, a reading path module 200, a first delay module 300 and a delay control module 400. The data path interface circuit 10 is configured with an internal port 11 and an external port 12. The internal port 11 is configured to connect with a memory block 30 inside a memory, transmit stored data to be written to the memory block 30 or read the stored data from the memory block. The external port 12 is configured to receive the stored data to be written sent from an external electronic device or send the stored data read in the memory block 30 to the external electronic device.

The writing path module 100 is connected to the internal port 11 and the external port 12 respectively, and is configured to transmit the stored data to the internal port 11 from the external port 12. An input end of the writing path module 100 is indirectly connected to the external port 12, specifically, the input end of the writing path module 100 is indirectly connected to the external port 12 through the first delay module 300, and an output end of the writing path module 100 is directly connected to the internal port 11. That is, the stored data to be written is input from the external electronic device, and reaches the memory block 30 through the external port 12, the first delay module 300, the writing path module 100 and the internal port 11 of the data path interface circuit, so that writing of the stored data is realized.

The reading path module 200 is connected to the internal port 11 and the external port 12 respectively, and is configured to transmit the stored data to the external port 12 from the internal port 11. An input end of the reading path module 200 is indirectly connected to the internal port 11, specifically, the input end of the reading path module 200 is indirectly connected to the internal port 11 through the first delay module 300, and an output end of the reading path module 200 is directly connected to the external port 12. That is, the stored data is read from the memory block 30, and reaches the external electronic device through the internal port 11, the first delay module 300, the reading path module 200 and the external port 12 of the data path interface circuit, so that reading of the stored data is realized. It should be understood that the data path interface circuit 10 only executes one of writing operation and reading operation at the same time. As a result, the writing path module 100 and the reading path module 200 output the stored data in a time-sharing mode.

The first delay module 300 is connected to the external port 12 and the internal port 11 respectively, and is configured to obtain the stored data from the external port 12 or the internal port 11, perform delay processing on the stored data, and transmit the delayed stored data to the writing path module 100 and/or the reading path module 200.

Specifically, when the stored data are written through the data path interface circuit 10, the first delay module 300 obtains the stored data from the external port 12, performs delay processing on the stored data and transmits the delayed data to the writing path module 100. The stored data to be written are written from data pins of the memory. Each of the data pins is connected to multiple memory blocks 30, and is configured to transmit the stored data to the connected multiple memory blocks 30. It should be understood that length of transmission paths between the external port 12 of each data path interface circuit 10 and the data pins is not the same. As a result, even if the data reaches the data pins simultaneously, the stored data cannot reach each memory block 30 simultaneously based on similar data transmission speed and different lengths of the transmission paths. In such a manner, an unsynchronized transmission phenomenon of the stored data recorded in the background art is caused. When the data path interface circuit 10 reading the stored data, the unsynchronized transmission phenomenon of the stored data also exists due to reasons similar to the reasons of unsynchronized writing data, which are not detailed again herein. In the embodiment, the first delay module 300 may perform delay processing on the received stored data for proper delay time, so that the stored data reaches the internal port 11 within a preset target time. In such a manner, the time that the stored data reaches the internal port 11 in each data path interface circuit 10 is the same or the time errors are within a bearable error range of the data path interface circuit 10, so that the unsynchronized transmission phenomenon of the stored data is solved.

Optionally, a function that the writing path module 100 and the reading path module 200 output the stored data in a time-sharing mode through various hardware structures may be realized. Illustratively, in the embodiment as shown in FIG. 1, the first delay module 300 is configured with an output end. The output end is connected to a writing path module 100 and a reading path module 200 respectively. The first delay module 300 outputs the delayed stored data to the wiring path module 100 and the reading path module 200 simultaneously. In addition, one of the writing path module 100 and the reading path module 200 may be controlled to be enabled for outputting stored data. In other embodiments, the first delay module 300 also may be configured with two output ends. The two output ends are respectively connected to a writing path module 100 and a reading path module 200 in a one-to-one correspondence. One of the two output ends of the first delay module 300 may be controlled to output stored data, so that only one of the writing path module 100 and the reading path module 200 may receive the stored data and output the stored data.

A delay control module 400 is connected to the first delay module 300 and is configured to receive a signal instruction from external and control delay time for the first delay module 300 to perform the delay processing according to the signal instruction. The signal instruction is an instruction that is configured to indicate the data path interface circuit 10 to execute corresponding operation, for example, at least one of a write instruction, a read instruction or a mode selection coding instruction. Illustratively, the write instruction is configured to indicate the data path interface circuit 10 to execute corresponding writing operation.

Specifically, the delay control module 400 may be configured with one or more input ends, and may be configured to generate a control signal of the first delay module 300 according to a signal instruction from the input end. For example, if the delay control module 400 is configured with an input end, a control signal may be generated in response to one of the write instruction, the read instruction and the mode selection coding instruction. If the delay control module 400 is configured with two input ends, a control signal may be generated in response to two of the write instruction, the read instruction and the mode selection coding instruction. It should be understood that the more the types of signal instruction needed for the delay control module 400, the more complex the logistics of generating the control signal, and correspondingly the more reliable and comprehensive the control function. In such a manner, the reliability and the completeness of the data path interface circuit 10 may be improved, i.e., the transmission synchronization of the stored data is improved to a greater extent.

In the embodiment, the data path interface circuit 10 includes a writing path module 100, a reading path module 200, a first delay module 300 and a delay control module 400. The writing path module 100 is connected to an internal port 11 and an external port 12 respectively, and is configured to transmit stored data to the internal port 11 from the external port 12. The reading path module 200 is connected to the internal port 11 and the external port 12 respectively, and is configured to transmit the stored data to the external port 12 from the internal port 11. The first delay module 300 is connected to the external port 12 and the internal port 11 respectively, and is configured to obtain the stored data from the external port 12 or the internal port 11, perform delay processing on the stored data, and transmit the delayed stored data to the writing path module 100 and/or the reading path module 200. The delay control module 400 is connected to the first delay module 300 and is configured to receive a signal instruction from external and control delay time for the first delay module to perform the delay processing according to the signal instruction. Based on a control signal from the delay control module 400, the first delay module 300 may perform delay processing on the received stored data for proper delay time, so that the stored data reaches the internal port 11 or the external port 12 within a preset target time. In such a manner, the transmission time of the stored data in each data path interface circuit 10 between the internal port 11 and the external port 12 is the same, or transmission time errors are within a bearable error range of the data path interface circuit 10, so that the data path interface circuit 10 with better transmission synchronization on the stored data is realized.

Figure 2:
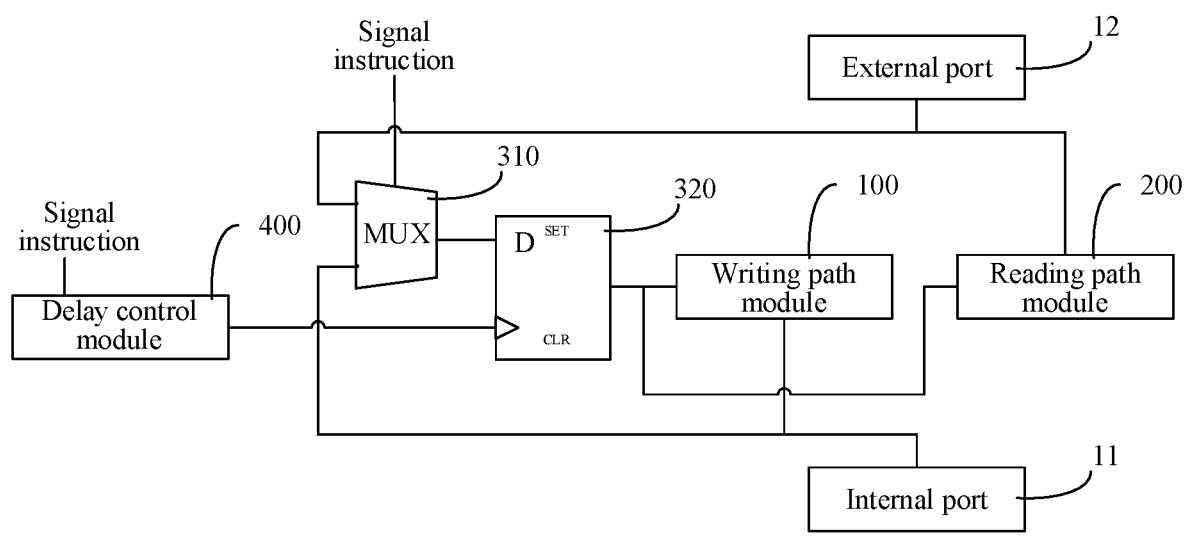
FIG. 2 is a structural schematic diagram of a data path interface circuit in a second embodiment.

FIG. 2 is a schematic structural diagram of a data path interface circuit 10 in a second embodiment. Referring to FIG. 2, in the embodiment, the first delay module 300 includes a selection unit 310 and a temporary storage unit 320. In the embodiment, a setting mode of the writing path module 100, the reading path module 200 and the delay control module 400 is the same with the setting mode in the embodiment in FIG. 1, which is not detailed again herein.

Input ends of the selection unit 310 are connected to the external port 12 and the internal port 11 respectively, and a control end of the selection unit 310 is configured to receive the signal instruction.

Specifically, the selection unit 310 is configured with two input ends, and the two input ends of the selection unit 310 are respectively connected to the internal port 11 and the external port 12 in a one-to-one correspondence to obtain stored data from the two ports respectively. The selection unit 310 is further configured with a control end, and the control end of the selection unit 310 is configured to receive a signal instruction to selectively output one of the received two stored data according to the signal instruction. Illustratively, the signal instruction may be a write instruction, so the selection unit 310 selectively outputs the stored data from the external port 12, so that writing of the data is realized. In the embodiment as shown in FIG. 2, the selection unit 310 is a one-of-two multiplexer. In other embodiments, the selection unit 310 also may be a one-of-three multiplexer and the like, that is, three input ends may be configured to realize a more complex selection function and transmission function.

A data input end of the temporary storage unit 320 is connected to an output end of the selection unit 310, and a control end of the temporary storage unit 320 is connected to an output end of the delay control module 400. The temporary storage unit 320 includes at least one of a latch, a flip-flop or a register. A control end of the temporary storage unit 320 includes at least one of a clock drive end, a set end or a reset end.

Specifically, in the embodiment as shown in FIG. 2, the temporary storage unit 320 may include a trigger, which is a D trigger. An input end of the D trigger is connected to the output end of the selection unit 310, the clock drive end of the D trigger is connected to the output end of the delay control module 400, and an output end of the D trigger is connected to the writing path module 100 and the reading path module 200 respectively. The D trigger samples a signal from the input end responsive to a control signal from the clock drive end. Thus, by adjusting the delay time of the control signal, sampling time of the D trigger may be controlled, so that the stored data reaches the internal port 11 or the external port 12 within a target time through the writing path module 100 or the reading path module 200. In such a manner, a data path interface circuit 10 with better timing synchronization is realized. Optionally, by configuring a set end and/or a reset end, and when the temporary storage unit 320 does not execute signal sampling, a preset enabling signal is output to the set end and/or the reset end, so that stable output of the temporary storage unit 320 may be ensured, and the reliability of the output signal of the data path interface circuit 10 is improved. In other embodiments, the temporary storage unit 320 also may be other devices with signal temporary storage functions such as a JK trigger and a RS trigger.

Further, the control signal includes at least one of a pulse signal, a signal rising edge or a signal falling edge. If the temporary storage unit 320 is a latch, it may be controlled through the pulse signal. If the temporary storage unit 320 is a flip-flop, it may be triggered through the signal rising edge or the signal falling edge. It should be understood that edge trigger may provide a greater timing margin, so as to improve the accuracy of sampling timing of the temporary storage unit 320, and then improve the reliability of the data path interface circuit 10.

Figure 3:
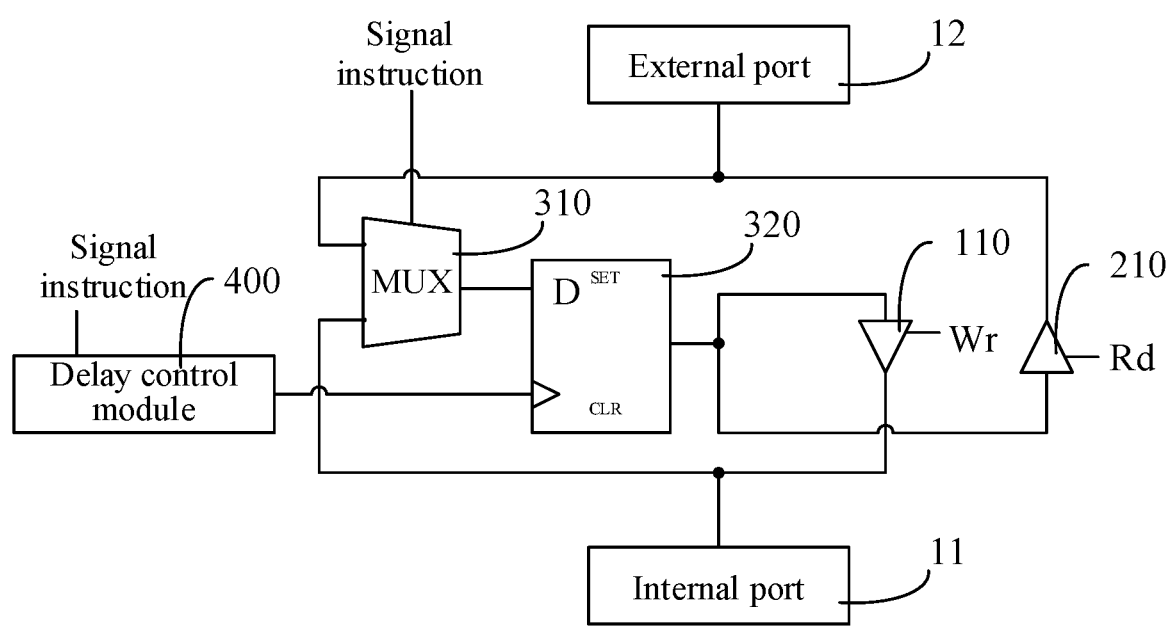
FIG. 3 is a structural schematic diagram of a data path interface circuit in a third embodiment.

FIG. 3 is a schematic structural diagram of a data path interface circuit 10 in a third embodiment. Referring to FIG. 3, in the embodiment, the writing path module 100 includes a writing buffer unit 100, and the reading path module 200 includes a reading buffer unit 210. In the embodiment, a setting mode of the selection unit 310, the temporary storage unit 320 and the delay control module 400 is the same with the setting mode in the embodiment in FIG. 2, which is not detailed again herein.

An input end of the writing buffer unit 110 is connected to an output end of the temporary storage unit 320, an output end of the writing buffer unit 100 is connected to the internal port 11, and a control end of the writing buffer unit 110 is configured to receive the signal instruction. The writing buffer unit 110 buffers and outputs the delayed stored data from the input end responsive to the signal instruction received at the control end, so that further adjustment of timing is realized to provide a writing path module 100 with better timing accuracy during writing of the stored data and a data path interface circuit 10. An input end of the reading buffer unit 210 is connected to an output end of the temporary storage unit 320, an output end of the reading buffer unit 210 is connected to the external port 12, and a control end of the reading buffer unit 210 is configured to receive the signal instruction. Similar to the writing buffer unit 110, the reading buffer unit 210 may be set to provide a reading path module 200 with better timing accuracy during reading of the stored data and a data path interface circuit 10.

Figure 4:
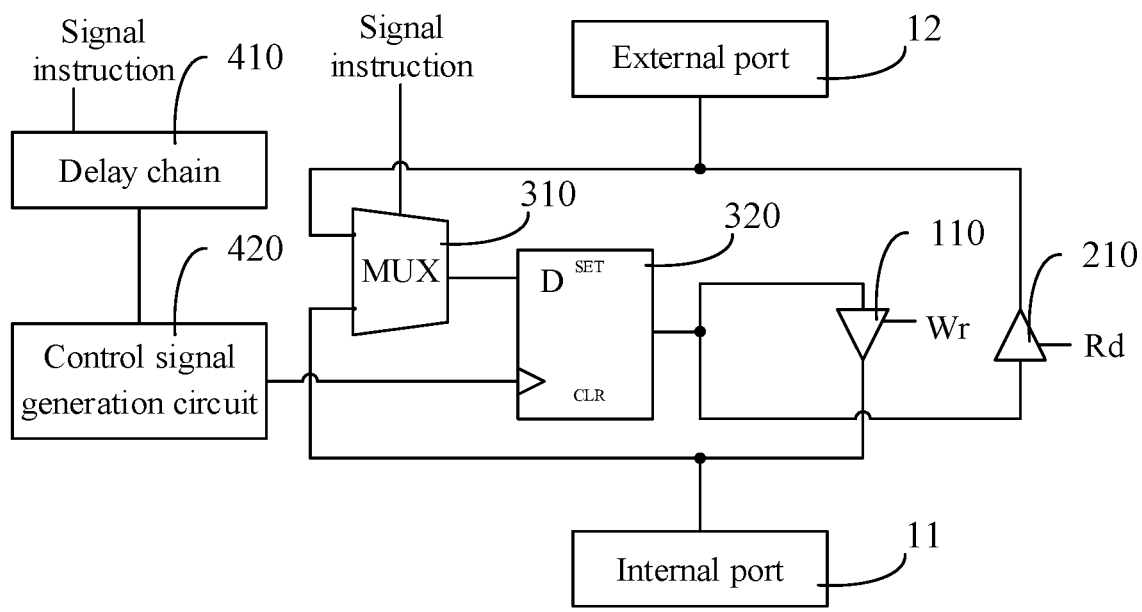
FIG. 4 is a structural schematic diagram of a data path interface circuit in a fourth embodiment.

FIG. 4 is a schematic structural diagram of a data path interface circuit 10 in a fourth embodiment. Referring to FIG. 4, in the embodiment, the delay control module 400 includes a delay chain 410 and a control signal generation circuit 420. In the embodiment, a setting mode of the selection unit 310, the temporary storage unit 320, the writing buffer unit 110 and the reading buffer unit 210 is the same with the setting mode in the embodiment in FIG. 3, which is not detailed again herein.

An input end of the delay chain 410 is configured to receive the signal instruction, and the delay chain is configured to delay and output the signal instruction.

In one embodiment, the delay chain 410 may be a fixed delay chain 410. Illustratively, the fixed delay chain 410 may include multiple transmission grates connected in series. Each of the transmission gates is configured with a fixed delay time. Thus, a corresponding number of transmission gates may be set according to the preset delay time needed for the delay chain 410, so that a target preset delay time is generated. Illustratively, the fixed delay chain 410 may include an even number of inverters connected in series. By setting the even number of inverters, it may be ensured that an output delay signal corresponds to an electric level state of the input signal instruction, and there is only a difference in timing. Similar to the fixed delay chain 410 consisting of the aforementioned transmission gates, a corresponding number of inverters may be set according to the preset delay time needed for the delay chain 410, so that a target preset delay time is generated.

In another embodiment, the delay chain 410 may be a programmable delay chain 410. It should be understood that properties such as signal transmission speed in the data path interface circuit 10 may change with a temperature and other conditions of use environment. As a result, if conditions of the use environment change, there will be a risk of timing abnormality and even transmitted signal error. In the embodiment, by setting the delay chain 410 consisting of the programmable delay chain 410 and setting a corresponding detection structure, condition changes of the use environment of the data path interface circuit 10 may be detected by the detection structure, and the delay time of the programmable delay chain 410 may be adjusted according to the detected results, so that timing errors are avoided and a data path interface circuit with better reliability is provided. The detection structure may be a sensor which detects the use environment, so as to adjust the delay time according to changes of the environment. The detection structure also may be a feedback circuit, i.e., the input is fed back according to the timing of the signal output from the data path interface circuit 10, so that accuracy of the timing is improved through a closed-loop adjustment.

Further, the programmable delay chain 410 may include multiple delay units. Each of the delay units is configured to generate delay with a set step length, and realize adjustment on the delay time through a coding group. Specifically, the coding group includes multiple control coding bits which are in one-to-one correspondence to the delay units. Illustratively, the programmable delay chain 410 includes 8 delay units, and the coding group includes 8 control coding bits. When a value of the coding group is 10000000, a first delay unit is controlled to turn on and other delay units are controlled to turn off, so that a delay with a set step length is generated. When the value of the coding group is 10000001, the first delay unit and an 8th delay unit are controlled to turn on, and other delay units are controlled to turn off, so that two delays with set step length are generated. As a result, the programmable delay chain 410 may be controlled by changing the value of the coding group. It should be noted that the examples are only used for description, and not used to limit the programmable delay chain 410 and the coding group specifically.

An input end of the control signal generation circuit 420 is connected to an output end of the delay chain 410, and an output end of the control signal generation circuit 420 is connected to the control end of the temporary storage unit 320. The control signal generation circuit 420 is configured to generate a control signal according to a signal output from the delay chain 410. Specifically, according to the description, when the control signal from the control signal generation circuit 420 is a pulse signal, a signal rising edge or a signal falling edge, the control signal may realize a more reliable timing control function on the temporary storage unit 320. It should be understood that the signal instruction and the delayed signal instruction may not certainly in an expected control signal form. Thus, a control signal which may be matched with the timing of the delayed signal instruction and is in a target form may be generated through the control signal generation circuit 420, so that accurate control on the temporary storage unit 320 is realized.

In one embodiment, the first delay module 300 and the delay control module 400 are configured with two operating modes. The two operating modes include a delay mode and a quick mode. In a case of the delay mode, the first delay module 300 and the delay control module 400 are valid. In a case of the quick mode, the delay control module 400 is invalid, and transmission delay on the stored data by the first delay module 300 is zero. The first delay module 300 and the delay control module 400 are valid, which means that a delay function of the first delay module 300 is enabled, and the delay control module 400 may delay the stored data correspondingly by generating a control signal according to the signal instruction. The first delay module 300 and the delay control module 400 are invalid, which means that the first delay module 300 only enables a transmission function of the stored data, and does not enable the delay function, so that the stored data pass through quickly, thereby increasing the operating speed of the data path interface circuit 10. It should be noted that the aforementioned "transmission delay is zero" means that the first delay module 300 does not set extra delay time for the stored data, but the wires and other structures in the first delay module 300 have a certain inherent delay. The delay time of the inherent delay is very short, i.e., the inherent delay may be ignored.

Figure 5:
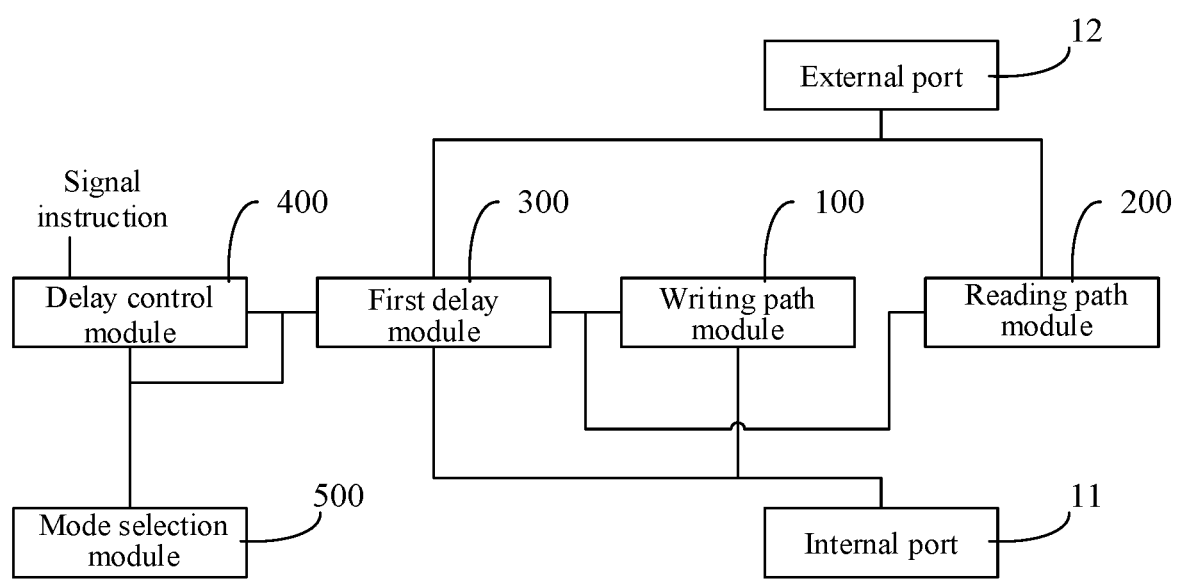
FIG. 5 is a structural schematic diagram of a data path interface circuit in a fifth embodiment.

FIG. 5 is a structural schematic diagram of a data path interface circuit 10 in a fifth embodiment. Referring to FIG. 5, in the embodiment, the data path interface circuit 10 further includes a mode selection module 500.

The mode selection module 500 is connected to the first delay module 300 and the delay control module 400 respectively, and is configured to receive the signal instruction, and control the operating modes of the first delay module 300 and the delay control module 400 according to the signal instruction. It should be understood that path lengths of receiving the stored data by the each of memory blocks 30 are different for different operating modes and different positions of the memory blocks 30. Thus, the data path interface circuit 10 corresponding to the memory block 30 with the longest data transmission path is set as the quick mode, so that the stored data passes through with highest speed. Data path interface circuits 10 of other memory blocks 30 are set as the delay mode, and the data path interface circuit 10 corresponding to each memory block 30 is controlled to generate corresponding delay, so that sum of transmission time consumed of the stored data on a transmission path and delay time are a set value, so that data transmission time corresponding each of the memory blocks 30 is the same. The set value may be transmission time corresponding the longest data transmission path.

Figure 6:
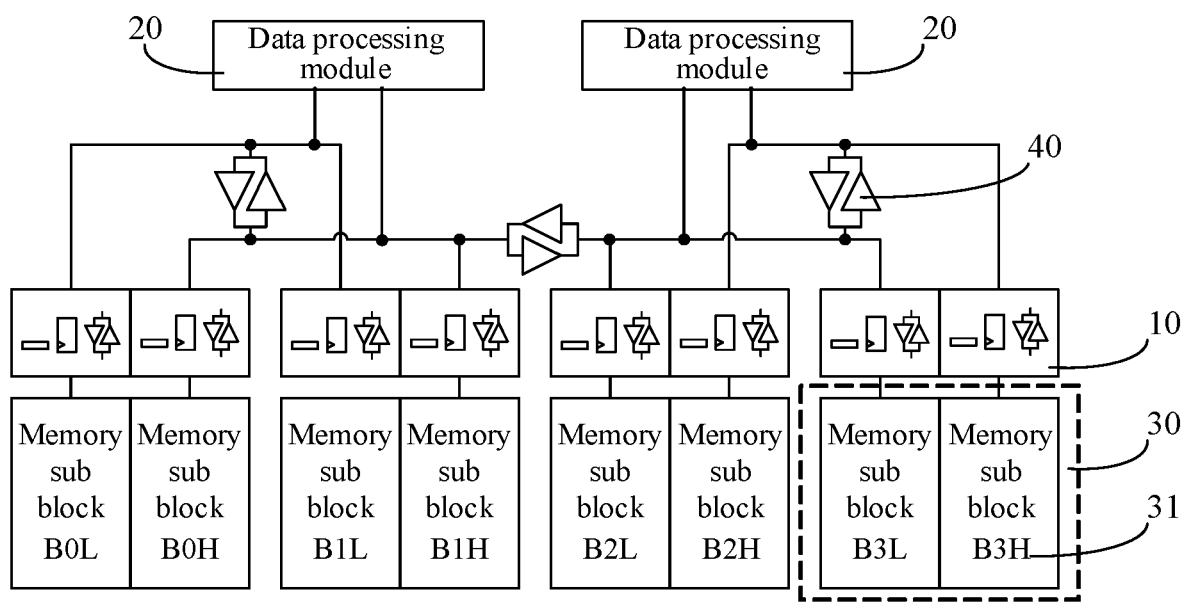
FIG. 6 is a structural schematic diagram of a memory in an embodiment.

FIG. 6 is a structural schematic diagram of a memory in an embodiment. Referring to FIG. 6, in the embodiment, the memory includes a data path interface circuit 10, a data processing module 20 and a memory block 30.

The data path interface circuit 10 is connected to the data processing module 20 and the memory block 30 respectively, so that timing processing on the transmitted stored data is realized.

The data processing module 20 is connected to the external port of the data interface circuit 10, and is configured to process the stored data. Illustratively, the processing on the stored data by the data processing module 20 may be serial/parallel converting for stored data transmission. It should be understood that the data processing module 20 may also execute other types of processing on the stored data to achieve the purpose of improving the transmission speed of the stored data and the like.

The memory block 30 is connected to the internal port 11 of the data interface circuit 10, and is configured to store the stored data. The memory block 30 may include at least two memory sub blocks 31, which are connected to a same memory block control circuit. The control circuit includes at least one of a row decoding circuit, a column decoding circuit or a redundant circuit. The control circuit may be shared to reduce the number of wirings in the memory, so that integral integration of the memory is improved. It should be understood that the control complexity also may be improved by sharing the control circuit. A proper circuit may be selected to share according to practical wiring needs, so that balance between integration and control difficulty is realized.

It should be noted that FIG. 6 shows multiple bidirectional drivers 40, which are arranged on a transmission path of stored data. The bidirectional drivers 40 in FIG. 6 are only used to schematically illustrate the length of the transmission path and data transmission speed. Specifically, it means that the data transmission path provided with the bidirectional drivers 40 is relatively long, and the data transmission speed is relatively slow. However, the bidirectional drivers shown in FIG. 6 are not used to limit the specific structure of the data transmission path in the embodiments of the present application. The bidirectional drivers 40 on each transmission path are not limited to the number and the set positions shown in FIG. 6.

Further, continuously referring to FIG. 6, the memory includes the multiple data path interface circuits 10 and the multiple memory blocks 30, and the data path interface circuits 10 and the memory blocks 30 are set in one-to-one correspondence. The external ports 12 of the multiple data path interface circuits 10 are connected to the same data processing module 20. The internal ports 11 of the data path interface circuits 10 are connected to the multiple memory sub blocks 31. Read stored data may reach the data processing module 20 from the memory sub blocks 31 through the internal ports 11 and the external ports 12 of the interface circuits, so that reading of the data is realized. The written-in stored data may reach the memory sub blocks 31 from the data processing module 20 through the external ports 12 and the internal ports 11 of the interface circuits, so that written-in of the data is realized. The transmission time of the stored data from an output end of the data processing module 20 to any of the memory sub blocks 31 is matched with each other, and/or the transmission time of the stored data from any of the memory sub blocks 31 to the data processing module 20 is matched with each other. It should be noted that transmission time matching includes that the data transmission time corresponding to each of the memory sub blocks 31 is completely the same, and errors among the data transmission time corresponding to different memory sub blocks 31 are within an acceptable range, i.e., accuracy of the stored data is not affected.

Further, in the embodiment shown in FIG. 6, two data processing modules 20 are configured to adapt to electronic devices with different configurations. Specifically, the data processing modules 20 are connected to the multiple data path interface circuits 10 respectively. When the memory is in a mode that one data processing module 20 is valid, the data processing module 20 is controlled to enable for transmitting data. When the memory is in a mode that multiple data processing modules 20 are valid, a set number of the data processing modules 20 are controlled to enable for synchronously transmitting data to the different memory blocks 30. Illustratively, when the memory is applied to a computer with a 64-bit system, computation speed and addressing ability of the computer are relatively strong, and therefore, the two data processing modules 20 may be enabled simultaneously to realize higher data transmission speed. When the memory is applied to a computer with a 32-bit system, only one data processing module 20 may be enabled, so that the stored data are ensured to be stably and reliably transmitted. The memory in the embodiment may select to enable a corresponding number of the data processing modules according to an external electronic device, so that application flexibility and universality of the memory are improved.

Figure 7:
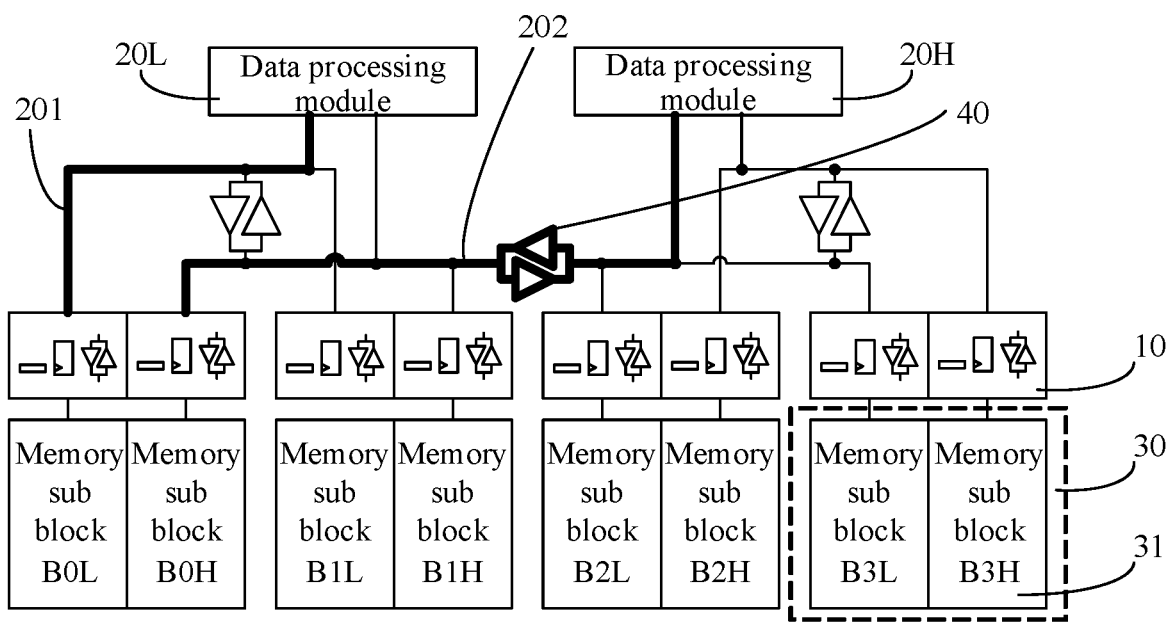
FIG. 7 is a schematic diagram showing an operating mode in which two data processing modules are valid in an embodiment.

Specifically, FIG. 7 is a schematic diagram showing a operating mode in which two data processing modules are valid in an embodiment. The embodiment of FIG. 7 takes the access to a memory sub block B0L and a memory sub block B0H as an example. Referring to FIG. 7, for the memory sub block B0H connected to a second data processing module 20H (High Byte) at the right side in FIG. 7, a data transmission path 202 is longer, so that the stored data needs to pass through a data path interface circuit 10 with a highest speed and reaches to the second data processing module 20H at a far end through a bidirectional driver 40 between circuits of the two data processing modules 20. For the memory sub module B0L connected to a first data processing module 20L (Low Byte) at the left side in FIG. 7, a data transmission path 201 is shorter, so that the stored data are delayed for a time in the data path interface circuit 10, and are output to the corresponding drivers according to a direction of reading-writing operation. The delay time of the interface circuit is configured to match the bidirectional driver 40 in the middle and the length of the corresponding transmission path. In the embodiment, data timings corresponding to the two memory sub blocks 31 (the memory sub block B0L and the memory sub block B0H) may be kept consistent. An adjusting way for the delay time of other memory blocks 30 is the same with the adjusting way of the memory sub block B0L and the memory sub block B0H, which is not detailed again herein.

FIG. 8 to FIG. 11 show a schematic diagram of a operating mode in which one data processing module 20 is valid of four embodiments. Referring to FIG. 8 to FIG. 11, the access to a memory sub block B0L, a memory sub block B0H, a memory sub block B3L and a memory sub block B3H is taken as an example respectively to illuminate for a operating mode in which one data processing module 20 is valid.

Figure 8:
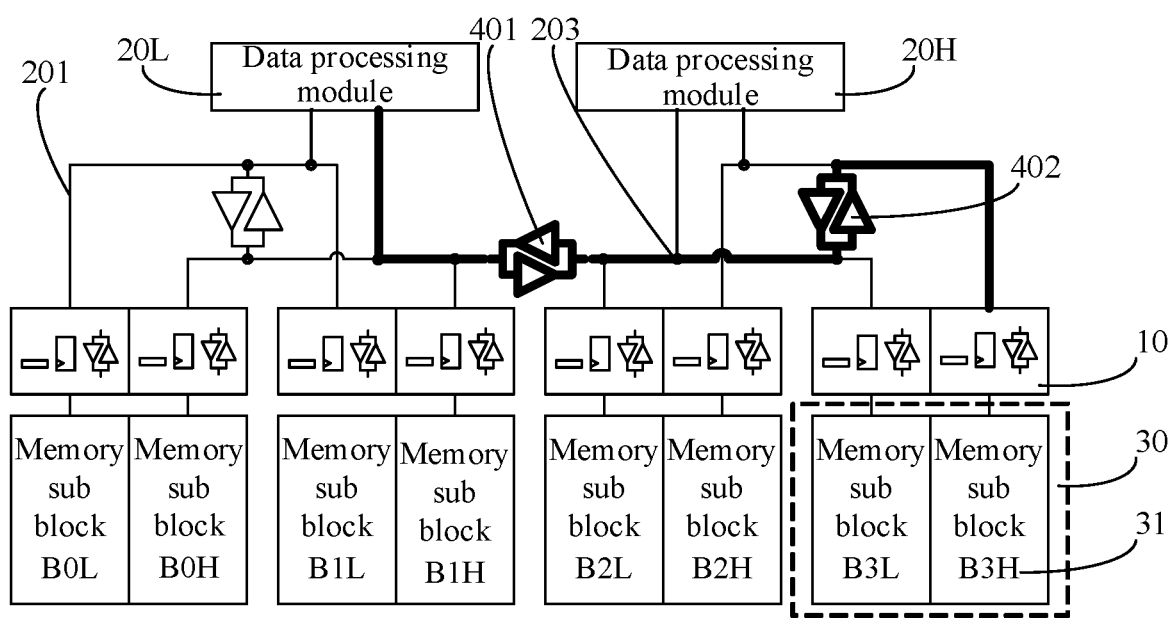
FIG. 8 is a schematic diagram showing an operating mode in which one data processing module is valid in a first embodiment.

As shown in FIG. 8, for an operating mode in which one data processing module 20L is valid, the longest transmission path is a data transmission path 203 (in black bold) from the first data processing module 20L to the memory sub block B3H. As a result, a data transmission path accessing to other positions needs to match with a data transmission path 203 accessing to the memory sub block B3H. The data transmission path 203 is named as a timing datum path herein. The timing datum path includes wirings and the data path interface circuit 10. When the memory sub block B3H is accessed, the data passes through the bidirectional driver 40 twice, one is a bidirectional driver 401 between the two data processing modules 20, and the other is a bidirectional driver 402 below the data processing module 20H. For the data path interface circuit 10, delay time control is skipped, i.e., the data path interface circuit operates in a quick mode and data is transmitted with a highest speed.

Figure 9:
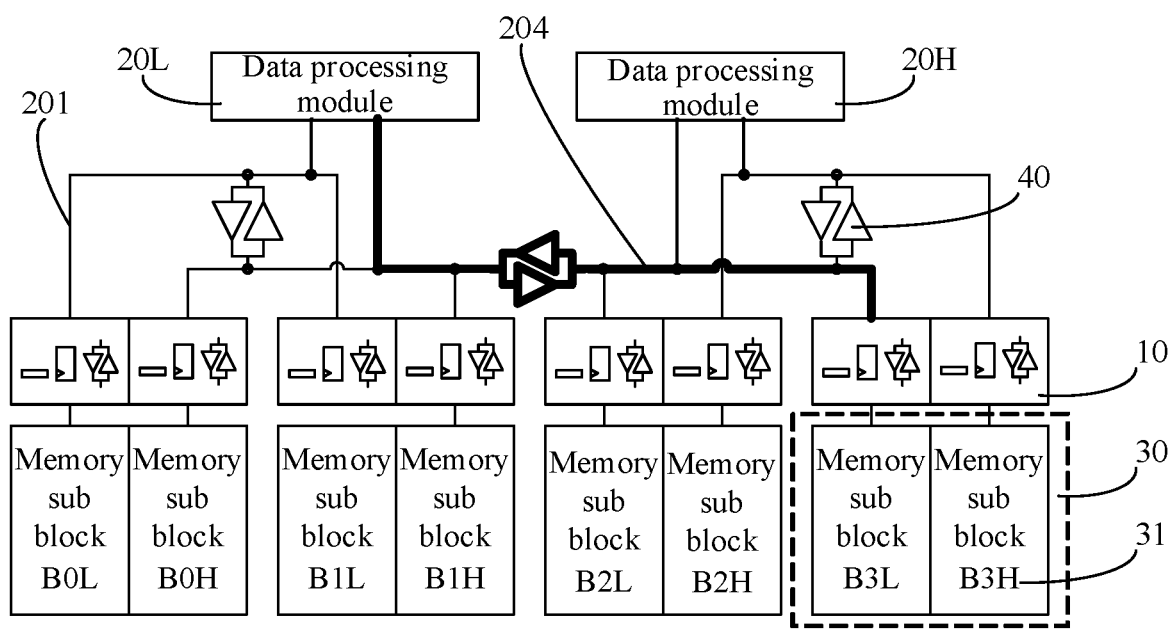
FIG. 9 is a schematic diagram showing an operating mode in which one data processing module is valid in a second embodiment.

Referring to FIG. 9, compared with the access to the memory sub block B3H, one bidirectional driver 40 and part of wirings are reduced on the data transmission path during access to the memory sub block B3L, and the transmission path is as shown in 204 in FIG. 9 (in black bold). As a result, a delay time circuit in the data path interface circuit 10 of the memory sub block B3L is operating, and the delay time is set to be matched with extra bidirectional driver 40 and related wirings on the data transmission path of the memory sub block B3H.

Figure 10:
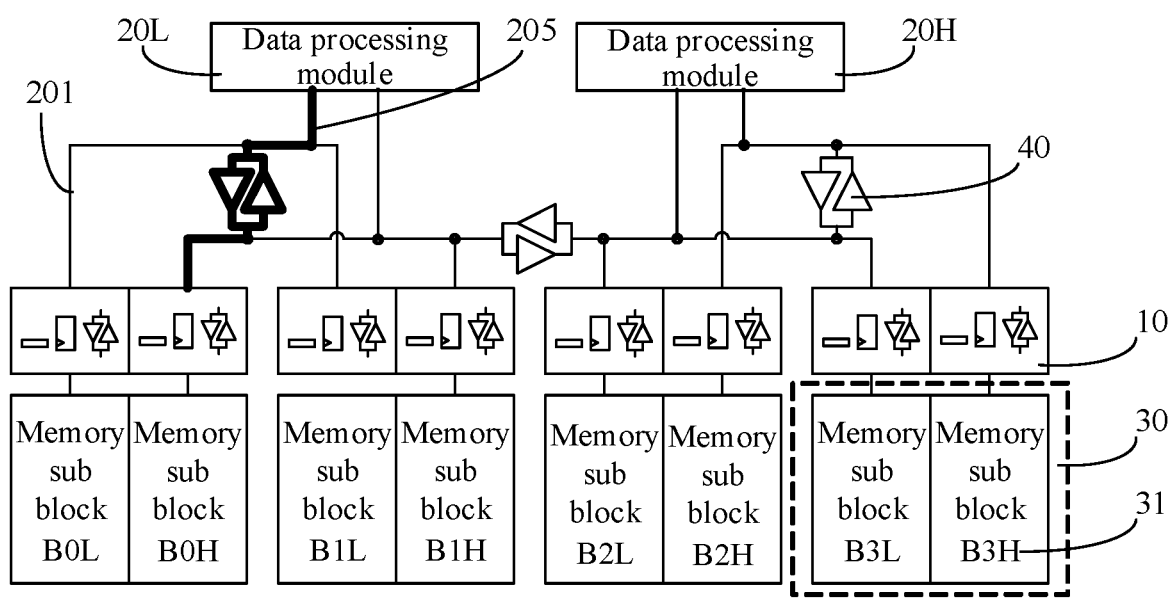
FIG. 10 is a schematic diagram showing an operating mode in which one data processing module is valid in a third embodiment.
Figure 11:
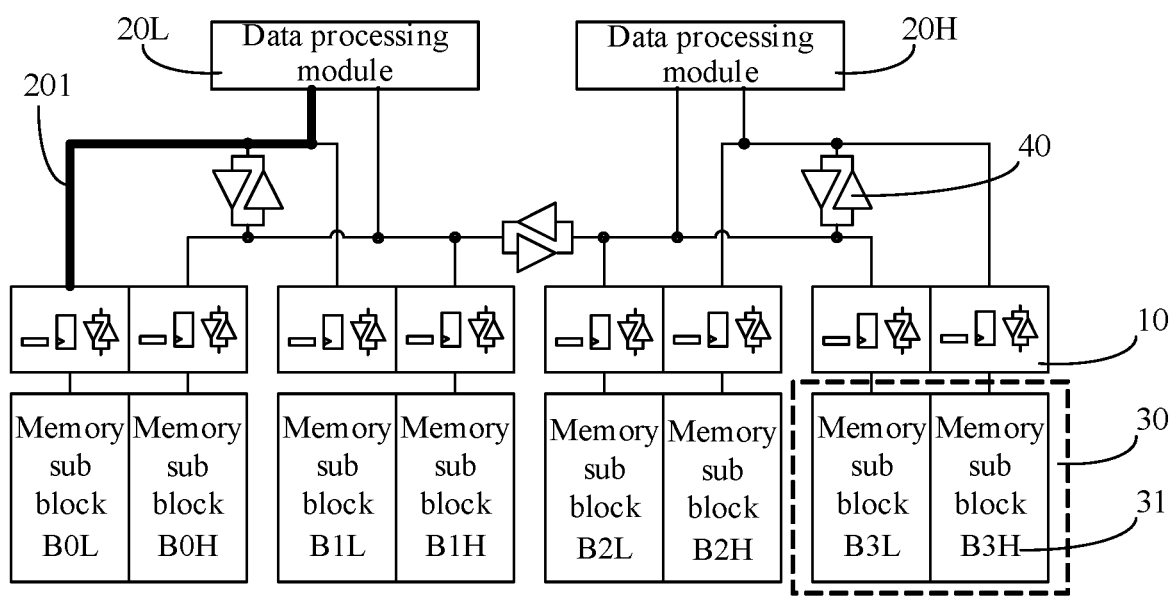
FIG. 11 is a schematic diagram showing an operating mode in which one data processing module is valid in a fourth embodiment.

Referring to FIG. 10 and FIG. 11, delay time generated by the delay time circuit in the data path interface circuit 10 is limited if access to the memory sub block B0L and the memory sub block B0H is reading operation. As a result, a signal instruction for the memory sub block B0L and the memory sub block B0H needs to be delayed for the delay time, and then sends to the memory sub block B0L and the memory sub block B0H respectively. In addition, the delay time may be matched with delay time introduced through the middle bidirectional driver 40 on the data transmission path of the memory sub block B3L and the memory sub block B3H. A transmission path from the data processing module 20L to the memory sub block B0H is denoted by 205 in FIG. 10 (in black bold). A transmission path from the data processing module 20L to the memory sub block B0L is denoted by 201 in FIG. 11 (in black bold).

Figure 12:
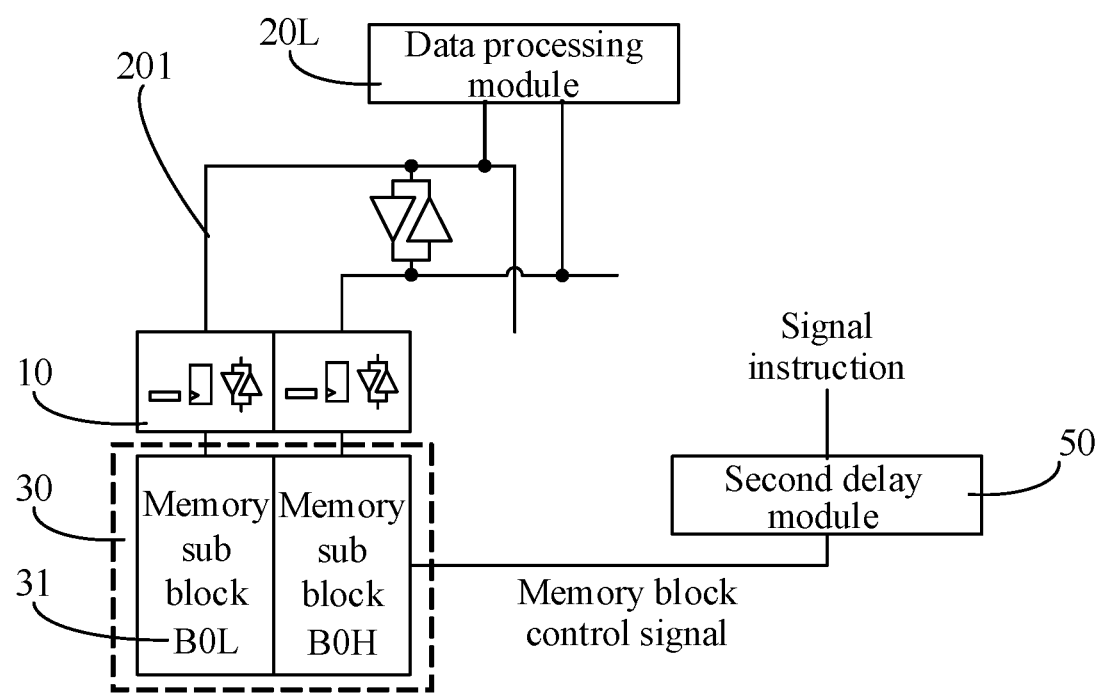
FIG. 12 is a structural schematic diagram of a memory in another embodiment.

FIG. 12 is a structural schematic diagram of a memory in another embodiment. FIG. 12 is a simplified drawing only showing a memory sub block B0L and a memory sub block B0H. Referring to FIG. 12, in the embodiment, the memory further includes a second delay module 50. The second delay module 50 may generate memory block control signal delay on the memory sub block B0L and the memory sub block B0H to further match with the delay time on the transmission path. Specifically, the second delay module 50 is connected to a memory block 30, and is configured to receive the signal instruction and generate a control signal for the memory block 30 according to the signal instruction. The control signal of the memory block 30 is configured to control time when the stored data enters the memory block 30. Based on the above structure, the delay time generated on the memory block control signal by the second delay module 50 is matched with the delay time generated on the stored data by the data path interface circuit 10. In the embodiment, the first delay module 300 and the second delay module 50 act simultaneously, so that transmission synchronization of the stored data among multiple memory sub blocks 31 may be further improved.

Continuously referring to FIG. 8, FIG. 9, FIG. 10, FIG. 11 and FIG. 12, delay time of the timing datum path 203 (in FIG. 8) is recorded as T1, delay time on wirings of the transmission path 204 (in FIG. 9) is recorded as T2A, delay time on the data path interface circuit 10 of the transmission path 204 (in FIG. 9) is recorded as T2B, delay time on wirings of the transmission path 205 (in FIG. 10) is recorded as T3A, delay time on the data path interface circuit 10 of the transmission path 205 (in FIG. 10) is recorded as T3B, delay time on wirings of the transmission path 201 (in FIG. 11) is recorded as T4A, delay time on the data path interface circuit 10 of the transmission path 201 (in FIG. 11) is recorded as T4B, and delay time that the signal instruction passes through the second delay module 50 to generate the memory block control signal is recorded as T4C. Sum of T2A and T2B, sum of T3A and T3B, and sum of T4A, T4B and T4C all should be matched with T1. The matching refers to equivalence or substantially equivalence or errors within an acceptable range.

The embodiments of the present application further provide a memory system, which includes the memory such as above, an electronic device and a processing module controller. The processing module controller is connected to the memory and the electronic device respectively, and is configured to enable a corresponding number of the data processing modules in the memory according to system information of the electronic device. In the embodiment, a memory system with higher stored data transmission synchronization is realized through the above structure. The specific setting mode of the memory may be referred to the above illustration, which is not detailed again herein The technical features of the above embodiments may be combined arbitrarily. For the sake of brevity, all possible combinations of the technical features therein are not described. However, as long as there is no contradiction in the combinations, all technical features should be considered within the range described in this specification.

The above embodiments only express several implementation manners of the present application, and descriptions thereof are relatively specific and detailed, but should not be understood as limiting the scope of the disclosure. It should be noted that modifications and improvements made by those of ordinary skill in the art without departing from the concept of the present application shall be within the protective scope of the present application. Therefore, the protective scope of the embodiments of present application shall be subject to the attached claims.

What is claimed is:

1. A data path interface circuit, comprising:
   a writing path module, connected to an internal port and an external port respectively;
   a reading path module, connected to the internal port and the external port respectively;
   a first delay module, connected to the external port and the internal port respectively, and configured to obtain write data from the external port or read data from the internal port, perform delay processing on the write data or the read data, and transmit the delayed write data to the writing path module and the delayed read data to the reading path module; and a delay control module, connected to the first delay module and configured to receive a signal instruction from external and control, according to the signal instruction, delay time for the first delay module to perform the delay processing;

wherein the first delay module comprises:
 a selection unit, input ends of the selection unit being connected to the external port and the internal port respectively, and a control end of the selection unit being configured to receive the signal instruction; and
 a temporary storage unit, a data input end of the temporary storage unit being connected to an output end of the selection unit, and a control end of the temporary storage unit being connected to an output end of the delay control module;

wherein an input end of the write path module is indirectly connected to the external port through the selection module and the temporary storage unit for transmitting the write data to the internal port form the external port; and wherein an input end of the reading path module is indirectly connected to the internal port through the selection module and the temporary storage unit for transmitting the read data to the external port from the internal port.

2. The data path interface circuit of claim 1, wherein the temporary storage unit comprises at least one of a latch, a flip-flop or a register; and the control end of the temporary storage unit comprises at least one of a clock drive end, a set end or a reset end.

3. The data path interface circuit of claim 1, wherein the writing path module comprises:
 a writing buffer unit, an input end of the writing buffer unit being connected to an output end of the temporary storage unit, an output end of the writing buffer unit being connected to the internal port, and a control end of the writing buffer unit being configured to receive the signal instruction; and
wherein the reading path module comprises:
 a reading buffer unit, an input end of the reading buffer unit being connected to the output end of the temporary storage unit, an output end of the reading buffer unit being connected to the external port, and a control end of the reading buffer unit being configured to receive the signal instruction.

4. The data path interface circuit of claim 1, wherein the delay control module comprises:
 a delay chain, an input end of the delay chain being configured to receive the signal instruction, the delay chain being configured to delay and output the signal instruction; and
 a control signal generation circuit, an input end of the control signal generation circuit being connected to an output end of the delay chain, an output end of the control signal generation circuit being connected to the control end of the temporary storage unit, and the control signal generation circuit being configured to generate a control signal according to a signal output from the delay chain.

5. The data path interface circuit of claim 4, wherein the delay chain is a programmable delay chain.

6. The data path interface circuit of claim 4, wherein the control signal comprises at least one of a pulse signal, a signal rising edge or a signal falling edge.

7. The data path interface circuit of claim 1, wherein the first delay module and the delay control module are configured with two operating modes comprising a delay mode and a quick mode; wherein in a case of the delay mode, the first delay module and the delay control module are valid; in a case of the quick mode, the delay control module is invalid, and transmission delay on the write data and the read data by the first delay module is zero; and wherein the data path interface circuit further comprises:
 a mode selection module, connected to the first delay module and the delay control module respectively, and configured to receive the signal instruction, and control the operating modes of the first delay module and the delay control module according to the signal instruction.

8. The data path interface circuit of claim 7, wherein the signal instruction comprises at least one of a write instruction, a read instruction or a mode selection coding instruction.

9. A memory, comprising:
 the data path interface circuit of claim 1;
 a data processing module, connected to the external port of the data path interface circuit, and configured to process the write data and the read data; and
 a memory block, connected to the internal port of the data path interface circuit, and configured to store the write data and the read data.

10. The memory of claim 9, further comprising:
 a second delay module, connected to the memory block, and configured to receive the signal instruction and generate a memory block control signal according to the signal instruction, wherein the memory block control signal is configured to control time when the write data and the read data enter the memory block.

11. The memory of claim 10, wherein delay time generated on the memory block control signal by the second delay module is matched with the delay time generated on the write data and the read data by the data path interface circuit.

12. The memory of claim 9, wherein the memory block comprises at least two memory sub blocks connected to a same memory block control circuit.

13. The memory of claim 12, wherein the memory block control circuit comprises at least one of a row decoding circuit, a column decoding circuit or a redundancy circuit.

14. The memory of claim 12, wherein the memory comprises a plurality of data path interface circuits and a plurality of memory blocks, the data path interface circuits being arranged in one-to-one correspondence to the memory blocks;
 wherein external ports of the plurality of data path interface circuits are connected to a same data processing module, and internal ports of the plurality of data path interface circuits are connected to a plurality of the memory sub blocks.

15. The memory of claim 14, wherein transmission time of the write data and the read data from an output end of the data processing module to any of the memory sub blocks is matched with each other.

16. The memory of claim 14, wherein transmission time of the write data and the read data from any of the memory sub blocks to the data processing module is matched with each other.

17. The memory of claim 14, wherein the memory comprises two data processing modules connected to the plurality of data path interface circuits respectively;

wherein when the memory is in a mode that one data processing module is valid, the data processing module is controlled to enable for transmitting data; and when the memory is in a mode that multiple data processing modules are valid, a set number of the data processing modules are controlled to enable for synchronously transmitting data to the different memory blocks.

18. A memory system, comprising:

the memory of claim 10;

an electronic device; and a processing module controller, connected to the memory and the electronic device respectively, and configured to enable a corresponding number of data processing modules in the memory according to system information of the electronic device.

\* \* \* \* \*